(12) United States Patent
Lee et al.

(10) Patent No.: US 7,608,995 B2
(45) Date of Patent: Oct. 27, 2009

(54) ELECTROLUMINESCENT DISPLAY APPARATUS

(75) Inventors: Ho Seok Lee, Suwon-si (KR); Jong-Woo Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/634,219

(22) Filed: Dec. 6, 2006

(65) Prior Publication Data

US 2007/0126357 A1 Jun. 7, 2007

(30) Foreign Application Priority Data

Dec. 7, 2005 (KR) .................. 10-2005-0118837

(51) Int. Cl.
*H05B 33/04* (2006.01)
*H05B 33/10* (2006.01)

(52) U.S. Cl. .................. 313/505; 313/512; 313/507

(58) Field of Classification Search .......... 313/498–512
See application file for complete search history.

(56) References Cited

U.S. PATENT DOCUMENTS

| 5,410,423 | A  | * | 4/1995 | Furushima et al. .......... 349/190 |
| 6,704,072 | B2 | * | 3/2004 | Jeong et al. .................... 349/73 |
| 6,933,537 | B2 | * | 8/2005 | Yee et al. ....................... 257/99 |
| 2003/0063078 | A1 | * | 4/2003 | Hanari et al. ............... 345/204 |

FOREIGN PATENT DOCUMENTS

| JP | 2001189191 A | * | 7/2001 |
| JP | 2005-019151 | | 1/2005 |

* cited by examiner

*Primary Examiner*—Nimeshkumar D. Patel
*Assistant Examiner*—Anne M Hines
(74) *Attorney, Agent, or Firm*—Lee & Morse, P.C.

(57) ABSTRACT

An electroluminescent display apparatus, including a substrate having a scale pattern, a display unit, a sealing substrate affixed to the substrate to enclose the display unit therebetween, and a sealant disposed on the scale pattern between the substrate and the sealing substrate.

2 Claims, 3 Drawing Sheets

ELECTROLUMINESCENT DISPLAY APPARATUS

BACKGROUND OF THE INVENTION

1. Field of the Invention

The present invention relates to an electroluminescent display apparatus. In particular, the present invention relates to an electroluminescent display apparatus having a substrate structure capable of facilitating measurement of a width of a sealant employed thereon.

2. Description of the Related Art

In general, an electroluminescent display apparatus may refer to a thin, light display device, such as an organic light emitting display device. The conventional electroluminescent display apparatus may include a display unit with a plurality of light emitting diodes positioned on a substrate.

Additionally, the conventional electroluminescent display apparatus may include a sealing substrate to protect the light emitting diodes from degradation caused by an oxidation, i.e., an interaction with oxygen from indium-tin-oxide (ITO) used in electrodes, a reaction between interfaces of light emitting layers, or by external impurities, e.g., moisture, oxygen, ultra-violet rays, manufacturing conditions, and so forth. The sealing substrate may be attached to the substrate by a sealant to enclose the display unit therebetween. The conventional sealant 80, as illustrated in FIG. 1, may include spacers 82 in an adhesive 81 to minimize compression of the display unit 20 and maintain a predetermined distance between the substrate 10 and the sealing substrate (not shown).

Application of the sealant 80 to the electroluminescent display apparatus may involve consideration of a width thereof. More specifically, the sealant 80 should be sufficiently wide to prevent penetration of external impurities therethrough. On the other hand, an excessive width of the sealant 80 may trigger sealant penetration into the display unit and cause a malfunction thereof. Accordingly, the width of the sealant 80 may be evaluated to provide proper operation of the electroluminescent display apparatus.

However, the width of the conventional sealant 80 employed in the conventional electroluminescent display apparatus is often evaluated by the naked eye upon attaching the substrate 10 with the sealing substrate. More importantly, the conventional sealant 80 may be transparent, thereby triggering measuring errors regarding the width thereof. Consequently, the width of the conventional sealant 80 in the conventional electroluminescent display apparatus may not be correctly measured and applied, thereby generating potential malfunctioning of the display unit.

Accordingly, there exists a need to provide an electroluminescent display apparatus having a structure capable of facilitating measurement of the sealant width employed therein.

SUMMARY OF THE INVENTION

The present invention is therefore directed to an electroluminescent display apparatus, which substantially overcomes one or more of the disadvantages of the related art.

It is therefore a feature of an embodiment of the present invention to provide an electroluminescent display apparatus having a substrate structure capable of facilitating measurement of a width of a sealant employed thereon.

At least one of the above and other features and advantages of the present invention may be realized by providing an electroluminescent display apparatus, including a substrate having a scale pattern, a display unit, a sealing substrate affixed to the substrate to enclose the display unit therebetween, and a sealant disposed on the scale pattern between the substrate and the sealing substrate.

The scale pattern may be formed along a perimeter of the substrate. The scale pattern may be discontinuous. Additionally, the scale pattern may include grooves in a surface of the substrate. Alternatively, the scale pattern may include protrusions on a surface of the substrate, wherein the protrusion may be formed of metal.

The scale pattern may include an outer pattern and an inner pattern spaced apart by a predetermined distance, wherein the predetermined distance may be about equal to a desired width of the sealant. The scale pattern may further include at least one intermediate pattern between the outer pattern and the inner pattern. The at least one intermediate pattern may be disposed between the outer pattern and the inner pattern and in parallel thereto. Further, the intermediate pattern may be positioned at equal distances between the outer and inner patterns. The scale pattern may include a plurality of intermediate patterns at equal intervals between the outer and inner patterns.

The sealant of the electroluminescent display apparatus may be disposed around the display unit. Additionally, the sealant may include an epoxy material.

The electroluminescent display apparatus may be an organic light-emitting display apparatus. Additionally, either the substrate or the sealing substrate of the electroluminescent display apparatus may be transparent.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
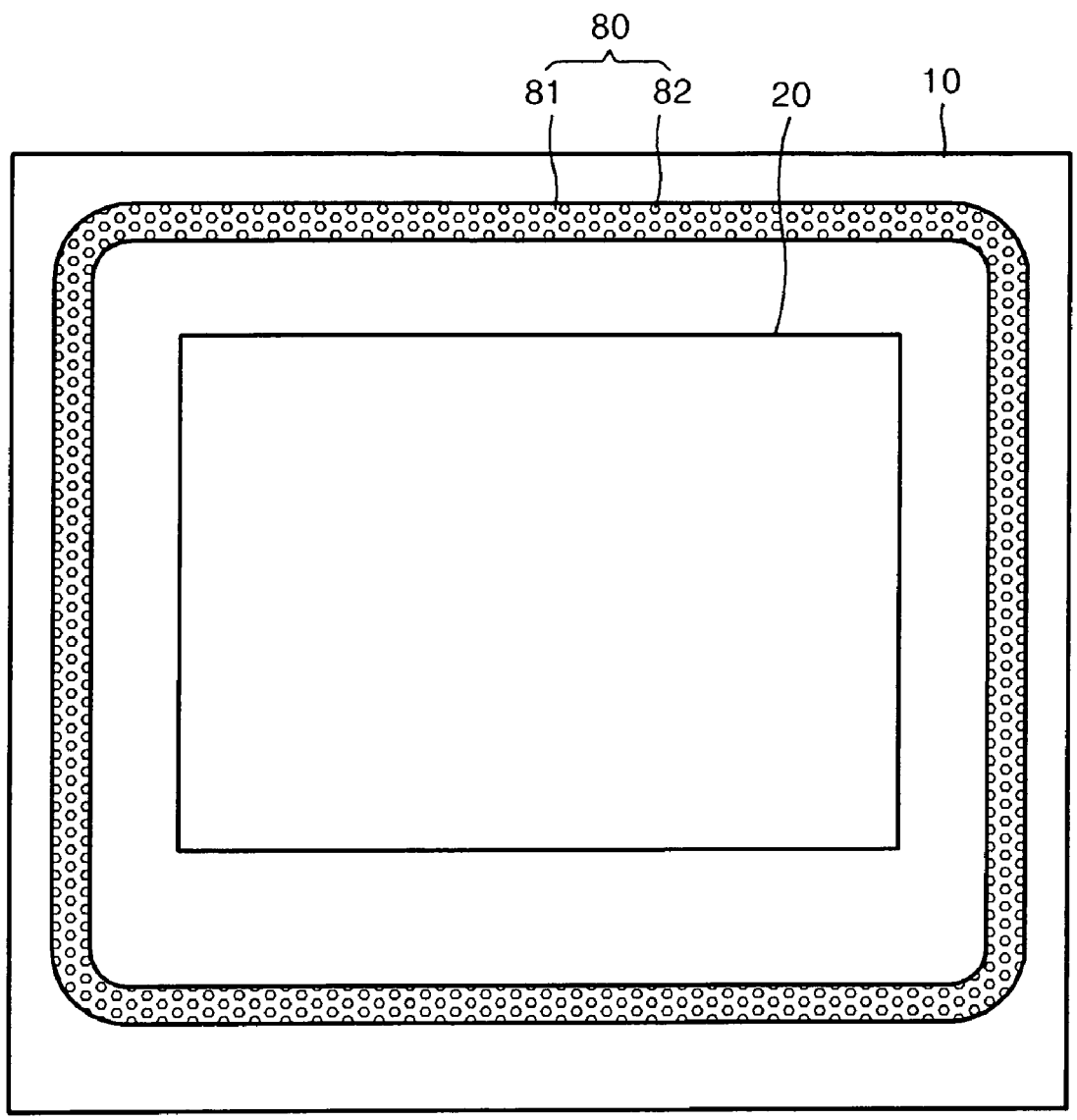
FIG. 1 illustrates a schematic plan view of a conventional electroluminescent display apparatus.

Korean Patent Application No. 10-2005-0118837, filed on Dec. 7, 2005, in the Korean Intellectual Property Office, and entitled: "Organic Light Emitting Display Apparatus," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when an element is referred to as being "on" another element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

An exemplary embodiment of an electroluminescent display apparatus according to the present invention is more fully described below with reference to FIG. 2.

Figure 2:
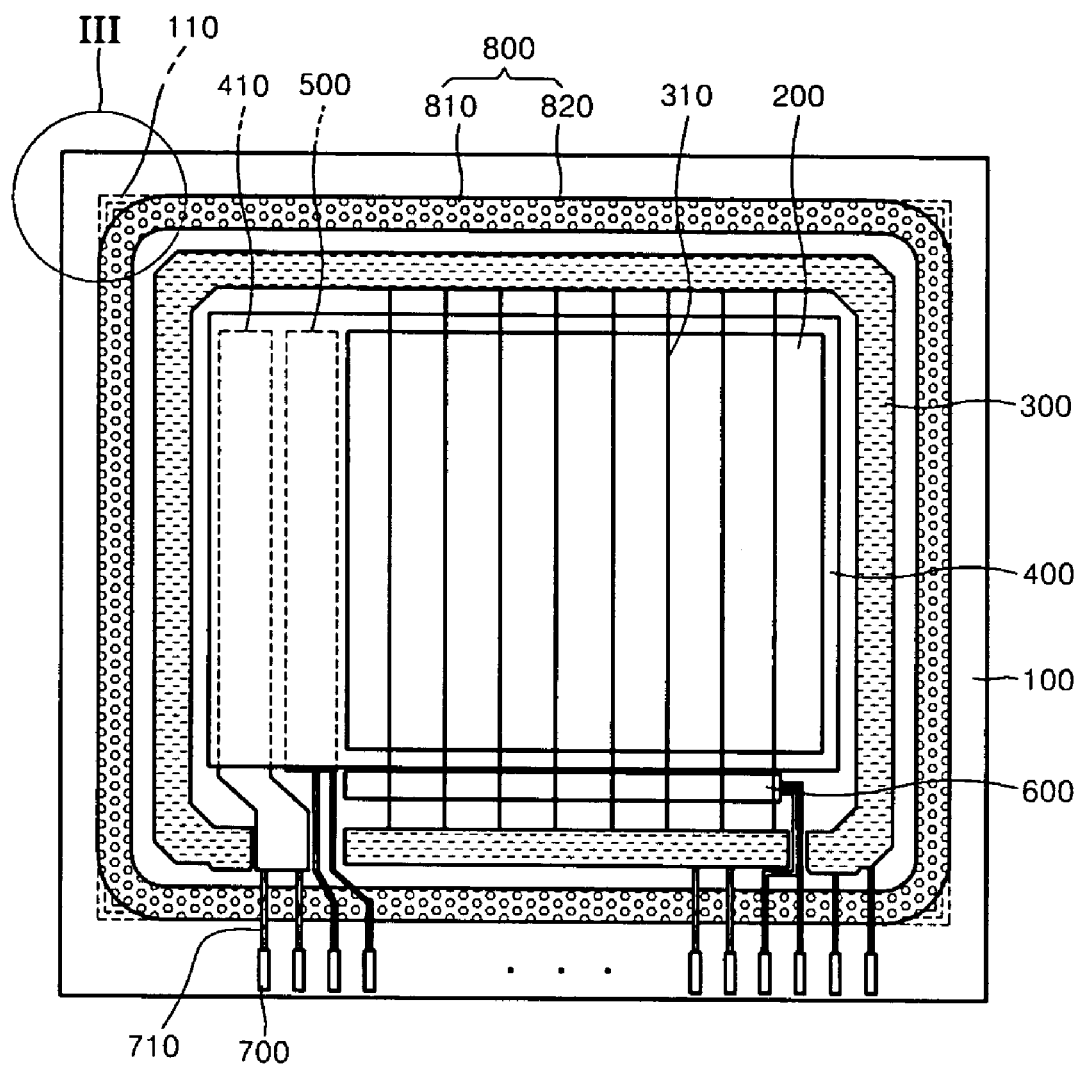
FIG. 2 illustrates a plan view of an electroluminescent display apparatus according to an embodiment of the present invention.

As illustrated in FIG. 2, an electroluminescent display apparatus according to an embodiment of the present invention may include a display unit 200, a substrate 100 made of glass, metal, or plastic, and a sealing substrate (not shown). Additionally, the electroluminescent display apparatus according to an embodiment of the present invention may include a sealant 800 to attach the sealing substrate to the substrate 100 having the display unit 200 therebetween.

The electroluminescent display apparatus according to an embodiment of the present invention may also include a vertical circuit unit 500, a horizontal circuit unit 600, and a driving power wire unit 300. The vertical and horizontal circuit units 500 and 600 may be positioned outside the display unit 200 and electrically connected to a terminal 700 via a wire 710 in order to transmit signals to a plurality of thin film transistors in the display unit 200. The driving power wire unit 300 may be positioned outside the display unit 200 and electrically connected to the terminal 700 via a plurality of driving lines 310 included in the display unit 200 in order to supply driving power thereto.

The display unit 200 of the electroluminescent display device according to an embodiment of the present invention may be an electroluminescent display unit, e.g., an organic light emitting display unit, having a plurality of light emitting diodes, e.g., organic light emitting diodes, positioned on the substrate 100 and forming a plurality of pixels. Each light emitting diode may include a pixel electrode (not shown), a facing electrode 400, and an intermediate layer therebetween (not shown) having at least one light-emitting layer.

The pixel electrode of the display unit 200 may be a transparent electrode or a reflective electrode. If the pixel electrode is a transparent electrode, it may be formed of any one of indium tin oxide (ITO), indium zinc oxide (IZO), zinc oxide (ZnO), or indium oxide ($In_2O_3$). If the pixel electrode is a reflective electrode, it may be formed of any one of indium tin oxide (ITO), indium zinc oxide (IZO), zinc oxide (ZnO), or indium oxide ($In_2O_3$) deposited on a reflection film made of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), any other like metal, or a combination thereof.

The facing electrode 400 of the display unit 200 may also be either a transparent electrode or a reflective electrode. Accordingly, if the facing electrode 400 is a transparent electrode, it may be formed of an auxiliary electrode layer or a bus electrode line deposited onto a metal material having a low work function. For example, the auxiliary electrode layer or the bus electrode line may be formed of any one of indium tin oxide (ITO), indium zinc oxide (IZO), zinc oxide (ZnO), or indium oxide ($In_2O_3$), and the metal material having a low work function may be any one of lithium (Li), calcium (Ca), lithium-fluoride-calcium (LiF/Ca), lithium-fluoride-aluminum (LiF/Al), silver (Ag), magnesium (Mg), aluminum (Al), a like metal, or a combination thereof. If the facing electrode 400 is a reflective electrode, it may be formed of a layer of lithium (Li), calcium (Ca), lithium-fluoride-calcium (LiF/Ca), lithium-fluoride-aluminum (LiF/Al), silver (Ag), magnesium (Mg), aluminum (Al), or a like metal material. However, it should be noted that other materials for forming the pixel electrode and facing electrode 400 are not excluded from the scope of the present invention. For example, the pixel electrode and the facing electrode 400 may be formed of an organic material, e.g., a conductive polymer.

The facing electrode 400 of the light emitting diode according to an embodiment of the present invention may be connected to the terminal 700 through an electrode wire unit 410 and the wire 710 positioned outside the display unit 200.

The intermediate layer of the display unit 200 may include at least one phosphorescent layer made of any known type of organic or inorganic light-emitting material known in the art, e.g., low-molecular weight organic material, polymeric organic material, and so forth, to emit light through a combination of holes and electrons supplied from the pixel electrode and facing electrode 400. If the intermediate layer is made of a low-molecular weight organic material, it may be formed of any one of copper phthalocyanine (CuPc), N,N'-di(naphthalene-1-yl)-N, N'-diphenyl-benzidine (NPB), tris-8-hydroxyquinoline aluminum (Alq3), or a like material by any method known in the art, such as an evaporation method. The intermediate layer may be formed to have a single or a composite structure having at least one of a hole injection layer (HIL), a hole transport layer (HTL), an emission layer (EML), an electron transport layer (ETL), and an electron injection layer (EIL). If the intermediate layer is formed of a polymeric organic material, it may be formed to have a structure including an HTL and an EML by way of screen printing or ink jet printing. The HTL may be formed of poly-(2,4)-ethylene-dihydroxythiophene (PEDOT), and the EML may be formed of Poly-Phenylenevinylene (PPV) or Polyfluorene polymer organic material. However, it should be noted that other structures of the intermediate layer are not excluded from the scope of the present invention.

Figure 3:
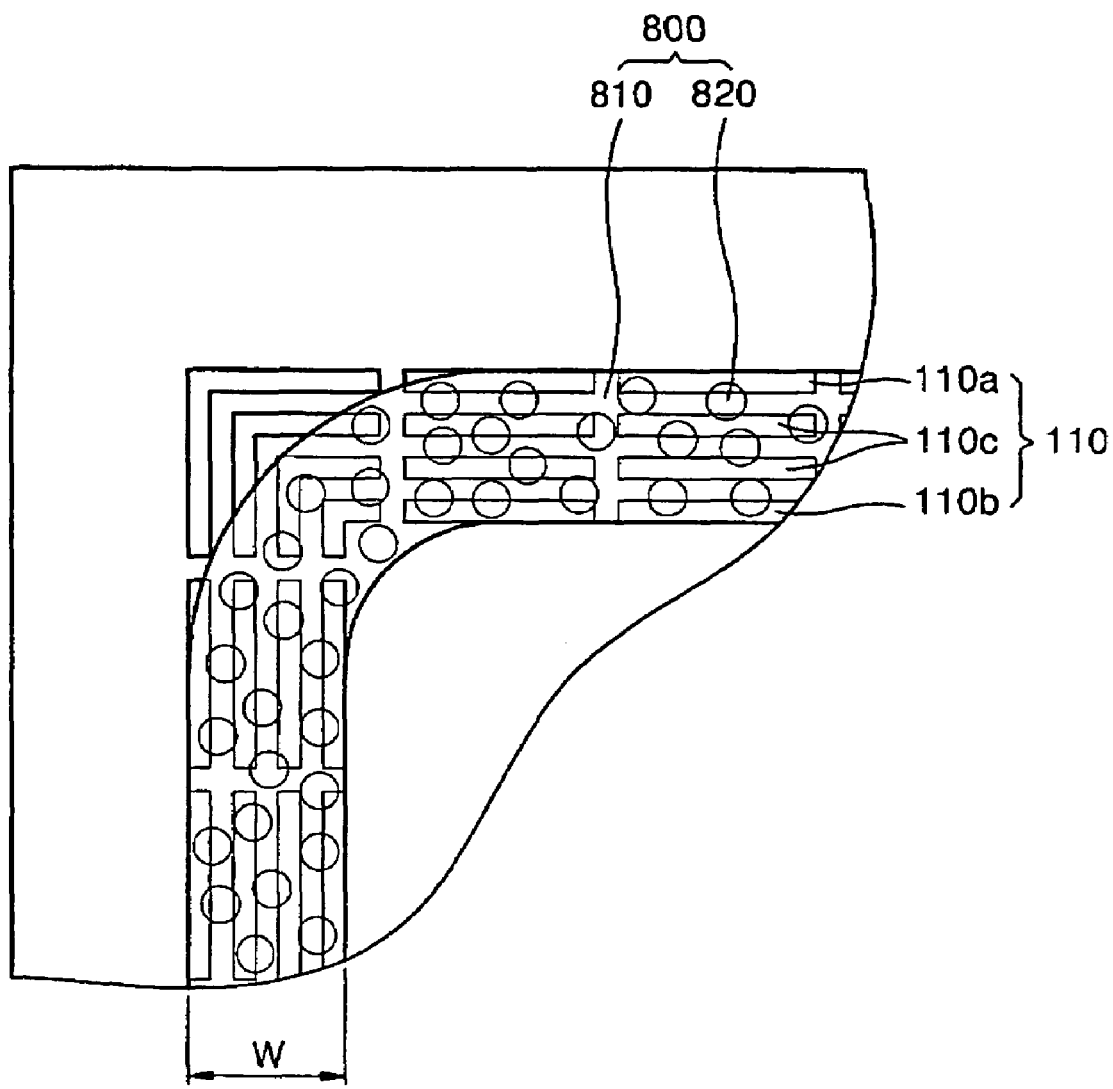
FIG. 3 illustrates an enlarged view of region "III" illustrated in FIG. 2.

The sealant 800 of the electroluminescent display apparatus according to an embodiment of the present invention may include an adhesive component 810 and a plurality of spacers 820, as illustrated in FIGS. 2-3. The adhesive component 810 may be any adhesive, e.g., epoxy material, known in the art that may be employed to attach the substrate 100 and the sealing substrate. The plurality of spacers 820 may be of any convenient material and shape as determined by one of ordinary skill in the art.

The sealant 800 may be formed around the display unit 200, as illustrated in FIG. 2. More specifically, the sealant 800 may be applied to peripheral areas, i.e., along a perimeter, of the substrate 100, such that the sealing substrate may be applied thereto to form an enclosed space therebetween for the display unit 200. Without intending to be bound by theory, it is believed that the adhesive component 810 and the geometric shape, i.e, a configuration surrounding the display unit 200, of the sealant 800 may minimize penetration of external impurities therethrough into the display unit 200. Additionally, it is believed that the use of the sealant 800 may prevent compression of the display unit 200 by the sealing substrate upon attachment of the sealing substrate to the substrate 100 and maintain a constant distance therebetween.

The substrate 100 of the electroluminescent display apparatus according to an embodiment of the present invention may include a scale pattern 110. The scale pattern 110 may include a series of continuous or discontinuous markings, e.g., bars, formed on the peripheral areas of the substrate 100, i.e., along a perimeter thereof, to correspond to the sealant 800 applied thereto. In other words, the sealant 800 may be applied to the peripheral areas of the substrate 100 that include the scale pattern 110, as illustrated in FIG. 3. Without intending to be bound by theory, it is believed that the scale pattern 110 may provide gradations of a ruler to facilitate measurement of a width of the sealant 800.

In this respect, it should be noted that "continuous" markings refer to uninterrupted markings formed along the entire perimeter of the substrate 100. "Discontinuous" markings refer to repetitive markings that are formed sequentially with intervals therebetween along the perimeter of the substrate 100. Further, a "width" of the sealant 800 refers to a distance as measured from one edge of the sealant 800 to a parallel edge of the sealant 800 along a direction parallel to a plane of the substrate 100, as illustrated in FIG. 3.

The scale pattern 110 may include an outer pattern 110a positioned along an outer perimeter of the scale pattern 110 and an inner pattern 110b positioned along an inner perimeter of the scale pattern 110 to have a predetermined distance therebetween. Each of the outer and inner patterns 110a and 110b may be either continuous or discontinuous. Additionally, each of the outer and inner patterns 110a and 110b may be parallel to an edge of the substrate 100.

In this respect, it should be noted that the "predetermined distance" refers to a constant distance between the outer and inner patterns 110a and 110b as measured in a direction parallel to the width of the sealant. More specifically, the predetermined distance may refer to a desirable width W of the sealant 800. It should further be noted that the "desirable distance W" refers to a width of the sealant 800 as determined by one of ordinary skill in the art to be sufficiently large to attach the substrate 100 to the sealing substrate and to prevent penetration of external impurities through it, while being sufficiently small to avoid excess penetration into the display unit. Without intending to be bound by theory, it is believed that forming the predetermined distance between the inner and outer patterns 100a and 110b to correspond to the desirable width W of the sealant 800 may be advantageous for determining an excessive or deficient amount of sealant 800 applied to the substrate 100.

The scale pattern 110 may further include an intermediate pattern 110c positioned at equal intervals between the inner and outer patterns 100a and 110b, as illustrated in FIG. 3. The intermediate pattern 110c may include any number of markings between the inner and outer patterns 100a and 100b as determined by one of ordinary skill in the art and should not be limited to the embodiment illustrated in FIG. 3. For example, the intermediate pattern 110c may include two or three parallel patterns between the inner and outer patterns 100a and 110b. A plurality of markings positioned between the inner and outer patterns 100a and 100b may facilitate determination of a deficient amount of sealant 800.

The scale pattern 110 may be formed at corner portions of the substrate 100 at any convenient shape, e.g., angular, curved, and so forth, that may correspond to a shape of the substrate 100 and the sealant 800 applied thereon. For example, as illustrated in FIG. 3, the scale pattern 100 may have an angular shape that may correspond to the shape of the substrate 100 and be extended beyond the sealant 800 to facilitate measurement thereof.

The scale pattern 110 may be formed as protrusions or grooves on a surface of the substrate 100. For example, the scale pattern 110 may be formed as metal protrusions by the same process employed for forming a thin film transistor of the display unit 200.

Without intending to be bond by theory, it is believed that employing the scale pattern 110 in the substrate 100 of the electroluminescent display apparatus in accordance with the present invention, may facilitate the measurement of the width W of the sealant 800 upon application thereof between the substrate 100 and the sealing substrate. In particular, the scale pattern 110 may provide an advantageous way for determining by the naked eye, i.e., visual detection without optical aides, the width of the sealant 800 and the deficient/excessive amount thereof. In this respect, it should be noted that observation of the sealant 800 may be facilitated if either the substrate 100 or the sealing substrate is transparent.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, even though the exemplary embodiment described herein refers to an electroluminescent display apparatus, it should be noted that other flat panel display apparatuses, e.g., liquid crystal display devices, are not excluded from the scope of the present invention.

What is claimed is:

1. An electroluminescent display apparatus, comprising:
   a substrate including a plurality of discrete markings arranged in a matrix pattern on a surface of the substrate, the plurality of discrete markings being positioned along a perimeter of the substrate and parallel to an edge of the substrate, each marking being completely spaced apart from an adjacent marking along a first direction and completely spaced apart from an adjacent marking along a second direction, the first and second directions being perpendicular to each other;
   a display unit on the substrate;
   a sealing substrate affixed to the substrate to enclose the display unit therebetween; and
   a sealant disposed on the plurality of markings between the substrate and the sealing substrate, at least one edge of the sealant being coextensive with an outermost edge of an outermost marking or with an innermost edge of an innermost marking.

2. The electroluminescent display apparatus as claimed in claim 1, wherein the markings are grooves or protrusions.

* * * * *